US006775905B2

(12) United States Patent
Tupper

(10) Patent No.: US 6,775,905 B2
(45) Date of Patent: Aug. 17, 2004

(54) METHOD FOR FORMING AN IMPROVED ADAPTOR

(75) Inventor: Joel Tupper, Bedford, NH (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 10/264,972

(22) Filed: Oct. 4, 2002

(65) Prior Publication Data

US 2003/0045171 A1 Mar. 6, 2003

Related U.S. Application Data

(62) Division of application No. 09/941,975, filed on Aug. 29, 2001, now Pat. No. 6,482,042.

(51) Int. Cl.$^{7}$ .................................................. H05K 3/00

(52) U.S. Cl. ............................. 29/842; 29/857; 29/884; 29/885; 174/251; 439/639

(58) Field of Search .......................... 29/832, 834, 836, 29/842, 847, 857, 874, 876, 877, 884, 885; 174/251, 260; 439/638, 639, 650

(56) References Cited

U.S. PATENT DOCUMENTS 3,705,378 A * 12/1972 Elkins ........................ 439/638
3,990,763 A * 11/1976 Kress ......................... 439/652
4,104,705 A * 8/1978 Levand et al. .............. 174/265
5,123,859 A * 6/1992 Davis et al. ................ 439/405
5,812,683 A 9/1998 Parker et al. ............... 381/309
5,921,816 A 7/1999 Larabell ...................... 361/686
5,921,817 A 7/1999 Niklos ..................... 439/540.1
6,048,224 A * 4/2000 Kay ........................... 439/445
6,134,121 A * 10/2000 Braxton ...................... 361/818
D433,998 S * 11/2000 Ishitsuka et al. ........... D13/123
6,146,153 A 11/2000 Koradia et al. ............. 439/638
6,193,655 B1 2/2001 McGrath .................... 128/897
6,419,399 B1 * 7/2002 Loder et al. .................. 385/53

* cited by examiner

*Primary Examiner*—A. Dexter Tugbang
*Assistant Examiner*—Donghai D. Nguyen
(74) *Attorney, Agent, or Firm*—Chapin & Huang, L.L.C.; David E. Huang, Esq.

(57) ABSTRACT

A method provides an improved adaptor. The method involves connecting a set of conductors to (i) a set of circuit board connector contacts of a circuit board connector and (ii) a set of switchbox connector contacts of a switchbox connector. The method further involves fastening a circuit board connector housing of the circuit board connector to a switchbox connector housing of the switchbox connector, and shrink wrapping a coating over the set of conductors to physically insulate the set of conductors using the coating and the housings of the circuit board connector and the switchbox connector.

7 Claims, 6 Drawing Sheets

METHOD FOR FORMING AN IMPROVED ADAPTOR

CROSS REFERENCE TO RELATED APPLICATIONS

This patent application is a Divisional of U.S. Application Ser. No. 09/941,975, filed Aug. 29, 2001, now U.S. Pat. No. 6,482,042, and entitled "TECHNIQUES FOR ACCESSING A CIRCUIT BOARD UTILIZING AN IMPROVED ADAPTOR," the teachings of which are hereby incorporated by reference herein in their entirety.

BACKGROUND OF THE INVENTION

A typical circuit board includes a section of printed circuit board (PCB) material (layers of conductive and non-conductive material sandwiched together), circuit board components, and a set of connectors. In general, the section of circuit board material provides (i) structural support for the circuit board components and the set of connectors, and (ii) a set of conducting paths (e.g., etch runs, power planes, etc.) that electrically connect with the circuit board components and the set of connectors. The circuit board components typically mount to the surface of the circuit board section and perform particular operations (e.g., instruction execution, data storage, data formatting, data transceiving, signal processing, etc.). Examples of circuit board components include integrated circuits (ICs), resistors, and capacitors. The set of connectors typically resides along a circuit board edge and enables the circuit board to exchange signals with other components (e.g., a backplane, another circuit board, a disk drive, etc.).

Some circuit boards include an extra connector that enables a user to directly access particular circuitry on the circuit board. For example, a circuit board can include a PCB connector that enables a user (e.g., a test or design engineer of a circuit board manufacturer) to connect a set of oscilloscope probes to the circuit board in order to sample signals for testing and debugging purposes. As another example, a user can connect a computer to the circuit board using a cable in order to program the particular circuitry (e.g., Field Programmable Gate Arrays), and/or test and debug that circuitry.

Furthermore, some specialized interface circuit boards include an extra connector to exchange one or more input/output (I/O) signals with an external device. For example, a printer interface circuit board typically includes a standard D-Subminiature (or D-Sub) connector for providing a printer signal to a printer. The printer typically includes a D-Sub connector as well. A user can then connect the D-Sub connector of the printer interface circuit board to the D-Sub connector of the printer using a standard printer cable (i.e., a cable having complementary D-Sub connectors at each end) thus enabling the printer to receive the printer signal from the printer interface circuit board.

SUMMARY OF THE INVENTION

Unfortunately there are deficiencies to the above-described conventional approaches to accessing a circuit board. For example, users typically prefer working with standard parts since such parts are readily available. Accordingly, users often prefer working with D-Sub cables since computer manufacturers typically provide computers having D-Sub connectors as I/O ports, and since D-Sub cables are readily available. That is, a user wishing to access circuit boards (e.g., circuit boards under test) using a computer having a D-Sub connector typically will prefer that the circuit boards have D-Sub connectors allowing that user to use a standard D-Sub cable (i.e., a D-Sub cable having D-Sub connectors at each end). Unfortunately, circuit board manufacturers typically do not attach D-Sub connectors to their non-interface circuit boards because such connectors are relatively large, i.e., because such connectors are bulky and have relatively large footprints requiring a relatively large amount of circuit board area and structural support compared to other connectors such as PCB connectors. That is, although the manufacturers of some I/O interface circuit boards (e.g., the manufacturers of printer interface circuit boards, Universal Serial Bus (USB) interface circuit boards, etc.) attach standard D-Sub connectors to their circuit boards, most other circuit board manufacturers may be unwilling to attach D-Sub connectors to their circuit boards simply for testing or debugging purposes.

However, some circuit board manufacturers may be willing to attach PCB connectors to their circuit boards for testing and debugging purposes. Users (e.g., an engineer or technician of a circuit board manufacturer) wishing to connect a computer to a circuit board having a PCB connector can customize a cable by cutting off the D-Sub connector from one end of a standard D-Sub cable, and fastening a PCB connector in its place. Then, the user can plug the remaining D-Sub connector of that cable into the D-Sub connector of the computer, and plug the newly fastened PCB connector of that cable onto the PCB connector of the circuit board in order to access signals on the circuit board, e.g., in order to test and debug the circuit board.

Unfortunately, the user may find using a customized cable to be cumbersome and time consuming when testing multiple circuit boards. That is, the user can initially run the customized cable between the test computer and the circuit board under test, and then plug in the D-Sub connector of the cable into the test computer and the PCB connector onto a first circuit board. In order to test another circuit board, the user must disconnect the PCB connector of the cable from the first circuit board and plug the PCB connector onto the next circuit board. The task of disconnecting the end of the cable from one circuit board and plugging it into another may require a substantial amount of user time and effort, particularly when the user is testing many circuit boards or when the user must frequently alternate between a fixed set of circuit boards individually (e.g., alternate among four circuit boards under test).

In contrast to conventional approaches to accessing circuit boards by (i) mounting D-Sub connectors to the circuit boards or (ii) mounting PCB connectors to the circuit boards and using a customized cable having a D-Sub connector on one end and a PCB connector on the other, some embodiments of the invention are directed to circuit board accessing techniques which use an adaptor having a circuit board connector and a switchbox connector (e.g., a D-Sub connector). A user (e.g., an engineer) can access a circuit board having a circuit board connector using a computer equipped with a switchbox connector by connecting the adaptor to the switchbox connector of the computer and then running a standard cable having a circuit board connector at both ends between the circuit board and the adaptor into order to enable the computer to communicate with the circuit board. Alternatively, the user can attach the circuit board connector of the adaptor to the circuit board connector of the circuit board, and then run a standard switchbox cable (e.g., a D-Sub cable) between the adaptor and the computer in order to enable the computer and the circuit board to communicate with each other. Other configurations enable the user to easily connect with and access multiple circuit boards using a connection system having multiple adaptors as well as other components.

One embodiment of the invention is directed to a connection system that includes a multi-port switch, multiple adaptors and multiple cable assemblies. The multi-port switch includes a primary port, multiple secondary ports, and a controller (e.g., a turnable knob) which is configured to connect the primary port individually to the multiple secondary ports. Each adaptor mates with one of the multiple secondary ports of the multi-port switch and includes (i) a circuit board connector having a set of circuit board connector contacts, (ii) a switchbox connector having a set of switchbox connector contacts, (iii) a fastener which physically fastens the circuit board connector of that adaptor and the switchbox connector of that adaptor together, and (iv) a set of conductors that electrically connects the set of circuit board connector contacts to the set of switchbox connector contacts. Each cable assembly includes a first circuit board connector which is configured to mate with the circuit board connector of an adaptor, and a second circuit board connector which is configured to connect with a circuit board. Such a connection system is suitable for accessing multiple circuit boards (e.g., by setting the controller of the multi-port switch in order to access any of the circuit board individually).

In one arrangement, the circuit board connector of each adaptor further includes a circuit board connector housing that defines a circuit board connector footprint, and the switchbox connector of each adaptor further includes a switchbox connector housing that defines a switchbox connector footprint. In this arrangement, the circuit board connector footprint is preferably smaller than the switchbox connector footprint. Accordingly, a manufacturer wishing to utilize the connection system can also save space by avoiding the use of the D-Sub connector on circuit boards but instead use the PCB connector which has a smaller footprint.

In one arrangement, the circuit board connector housing of the circuit board connector of each adaptor defines a circuit board mounting interface and a connector interface that is at a right angle to the circuit board mounting interface. The switchbox connector housing of the switchbox connector of that adaptor defines a cable attachment interface and a D-Subminiature connector interface. The set of conductors of that adaptor extends from the circuit board mounting interface defined by the circuit board connector housing to the cable attachment interface defined by the switchbox connector housing. The right angle configuration of the switchbox connector enables (i) the circuit board mounting interface defined by the circuit board connector housing and the cable attachment interface defined by the switchbox connector housing to be close together, and (ii) the set of conductors to be fairly short.

In one arrangement, for each of the multiple adaptors, the set of circuit board connector contacts includes 10 soldering pins. Additionally, for each of the multiple adaptors the switchbox connector housing is configured to hold, as the set of switchbox connector contacts, up to 25 crimps. Furthermore, for each of the multiple adaptors, the set of conductors includes (i) a first wire that electrically connects a transmit signal pin of the 10 soldering pins to a transmit signal crimp which inserts into a transmit signal crimp location of the switchbox connector housing, (ii) a second wire that electrically connects a receive signal pin of the 10 soldering pins to a receive signal crimp which inserts into a receive signal crimp location of the switchbox connector housing, and (iii) a third wire that electrically connects a ground signal pin of the 10 soldering pins to a ground signal crimp which inserts into a ground signal crimp location of the switchbox connector housing. This arrangement enables preservation of a standard contact layout in each of the connectors (e.g., the RS-232 layout).

In one arrangement, the fastener of each adaptor includes an adhesive (e.g., glue) that attaches the circuit board connector housing of the circuit board connector of that adaptor to the switchbox connector housing of the switchbox connector of that adaptor. This arrangement enables the two housings to be attached using a very simple and low cost means.

In one arrangement, each adaptor further includes a shrink wrap coating that, in combination with the circuit board connector housing of the circuit board connector of that adaptor and the switchbox connector housing of the switchbox connector of that adaptor, physically insulates the set of conductors of that adaptor. Accordingly, the adaptor is less prone to damage from inadvertent handling or contact.

In one arrangement, the connection system further includes an electronic device (e.g., a computer) that electrically connects to the primary port of the multi-port switch, and multiple circuit boards that electrically connect to multiple secondary ports of the multi-port switch. In this arrangement, the user can individually access (e.g., test) the circuit boards using the electronic device.

The features of the invention, as described above, may be employed in connection systems (e.g., testing and debugging systems), devices and methods as well as other computer-related components such as those of EMC Corporation of Hopkinton, Massachusetts.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the invention are directed to circuit board accessing techniques which utilize an adaptor having a printed circuit board (PCB) connector and a switchbox connector (e.g., a D-Sub connector). A user (e.g., an engineer or technician) can access a circuit board having a PCB connector using a computer (an electronic device) equipped with a switchbox connector by connecting the adaptor to the switchbox connector of the computer and then running a standard cable having a PCB connector at both ends between the circuit board and the adaptor into order to enable the computer to communicate with the circuit board.

Alternatively, the user can attach the PCB connector of the adaptor to the PCB connector of the circuit board, and then run a standard D-Sub cable (i.e., a cable having a D-Sub connector at both ends) between the adaptor and the computer in order to enable the computer and the circuit board to communicate with each other. Other configurations enable the user to easily connect with and access multiple circuit boards using a connection system having multiple adaptors as well as other components.

Figure 1:
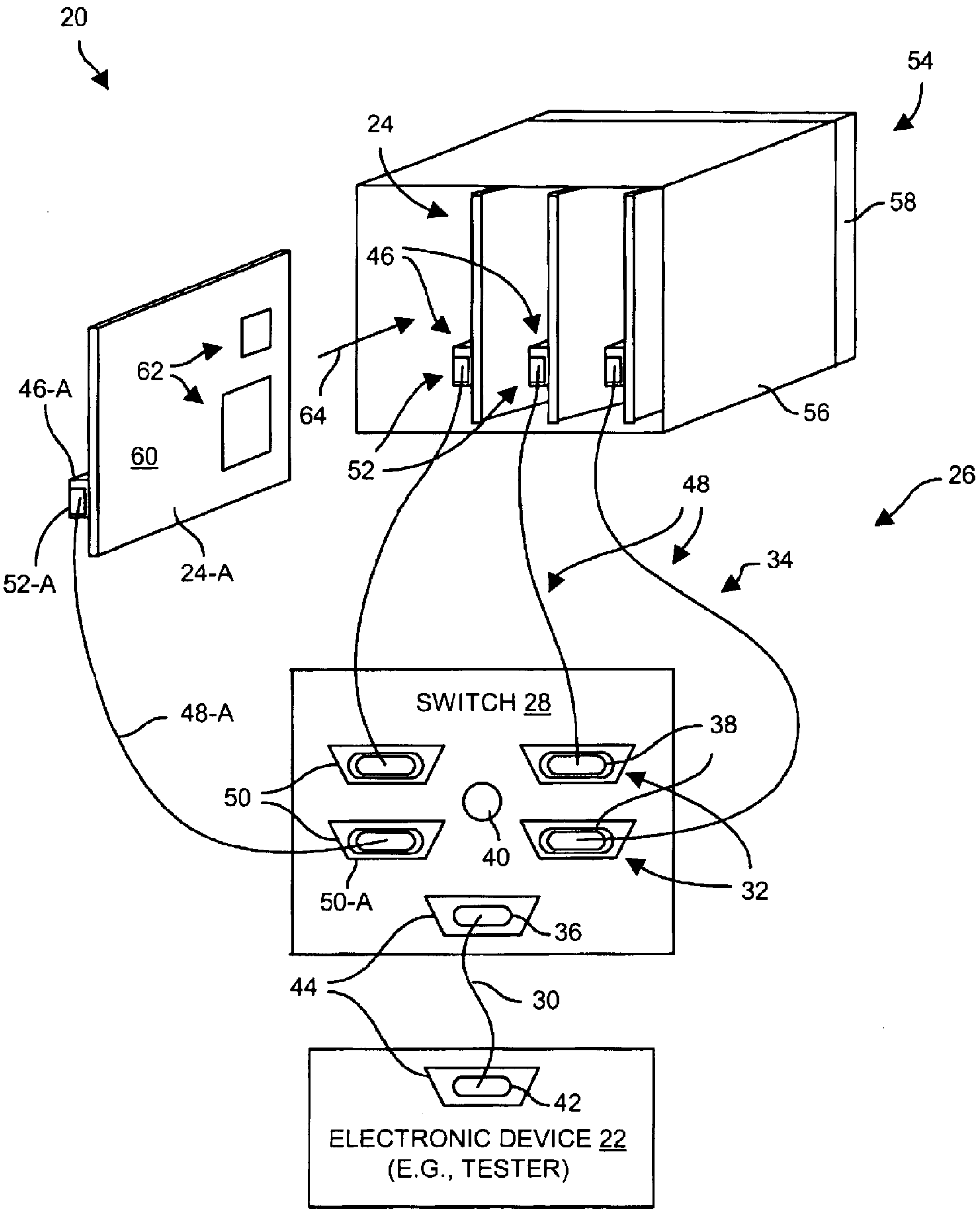
FIG. 1 is a diagram of a connection system which is suitable for use by the invention.

FIG. 1 shows a connection system 20 which is suitable for use by the invention. The connection system 20 includes an electronic device 22, a set of circuit boards 24 and connection components 26 which are capable of connecting the electronic device 22 individually to the set of circuit boards 24. In one arrangement, the electronic device 22 is a tester (e.g., a computer) which is configured to individually test the circuit boards 24 through the connection components 26 (e.g., the electronic device is configured to read and verify data from the circuit boards 24). As will be explained shortly, the connection components 26 include a set of adaptors that enable a user to combine and utilize readily available standard components to connect the electronic device 22 with the circuit boards 24.

The additional connection components 26 include a multi-port switch 28 (e.g., a switchbox), a cable 30, a set of adaptors 32 and a set of cable assemblies 34. The multi-port switch 28 includes a primary port 36, a set of secondary ports 38 and a controller 40 (e.g., a turnable knob). The controller 40 controls the operation of the multi-port switch 28. In particular, the multi-port switch 28 is capable of connecting the primary port 36 to any of the secondary ports 38, one at a time, depending on how the controller 40 is set. For example, a user can set the controller 40 to a first position in order to connect the primary port 36 to one secondary port 38. The user can then move the controller 40 to a second position to connect the primary port 36 to another secondary port 38, and so on.

The electronic device 22 preferably includes a port 42 which has the same type of connector interface as that of the primary port 36 of the multi-port switch 28 thus enabling the cable 30 to be a standard, off-the-shelf cable having the same type of connector interface at each end. In one arrangement, the port 42 of the electronic device 22, the primary port 36 of the multi-port switch 28, and connectors 44 of the cable 30 each have D-Sub connector interfaces. Accordingly, the user does not need to obtain or make a customized cable in order to connect the electronic device 22 with the multi-port switch 28.

The circuit boards 24 preferably include connectors 46 which have a different connector interface than that of the secondary ports 38 of the multi-port switch 28. In one arrangement, the connectors 46 are PCB connectors having PCB connector interfaces, and the secondary ports 38 (as well as the primary port 36) of the multi-port switch 28 have D-Sub connector interfaces. Accordingly, the user can use a standard, off-the-shelf switchbox as the multi-port switch 28. Furthermore, the circuit boards 24 can conserve circuit board area by using smaller footprint PCB connectors, i.e., connectors having smaller footprints compared to that of D-Sub connectors.

It should be understood that each adaptor 32 provides multiple connector interfaces that enable the user to use standard, off-the-shelf cables as the cable assemblies 34. In one arrangement (and as will be described later in connection with FIG. 2), each adaptor 32 has a D-Sub connector interface for connecting with the multi-port switch 28, and a PCB connector interface. Accordingly, the user can use, as the cable assemblies 34, a standard cable having (i) a section of cable 48, (ii) a PCB connector 50 at one end for connecting to an adaptor 32, and another PCB connector 52 at the other end for connecting with a connector 46 of a circuit board 24. As a result, the user does not need to obtain or make customized cables. Furthermore, the user does not need to plug and unplug a single cable each time the user wishes to test a new circuit board. Rather, the user can simply change the setting of the controller 40 of the multi-port switch 28 to access a new circuit board 24.

By way of example only, the circuit boards 24 insert and operate within a card cage assembly 54 having a chassis 56 and a backplane 58. In addition to the connectors 46, the circuit boards 24 include sections of circuit board material 60 and operating circuitry 62. For example, the circuit board 24-A inserts into the card cage assembly 54 when moved in the direction 64. Once a circuit board 24 is installed, the electronic device 34 is capable of accessing signals from the operating circuitry 62 (e.g., data for testing and debugging purposes) of that circuit board 24 through the connection components 26. Further details of the invention will now be provided with reference to FIG. 2.

Figure 2:
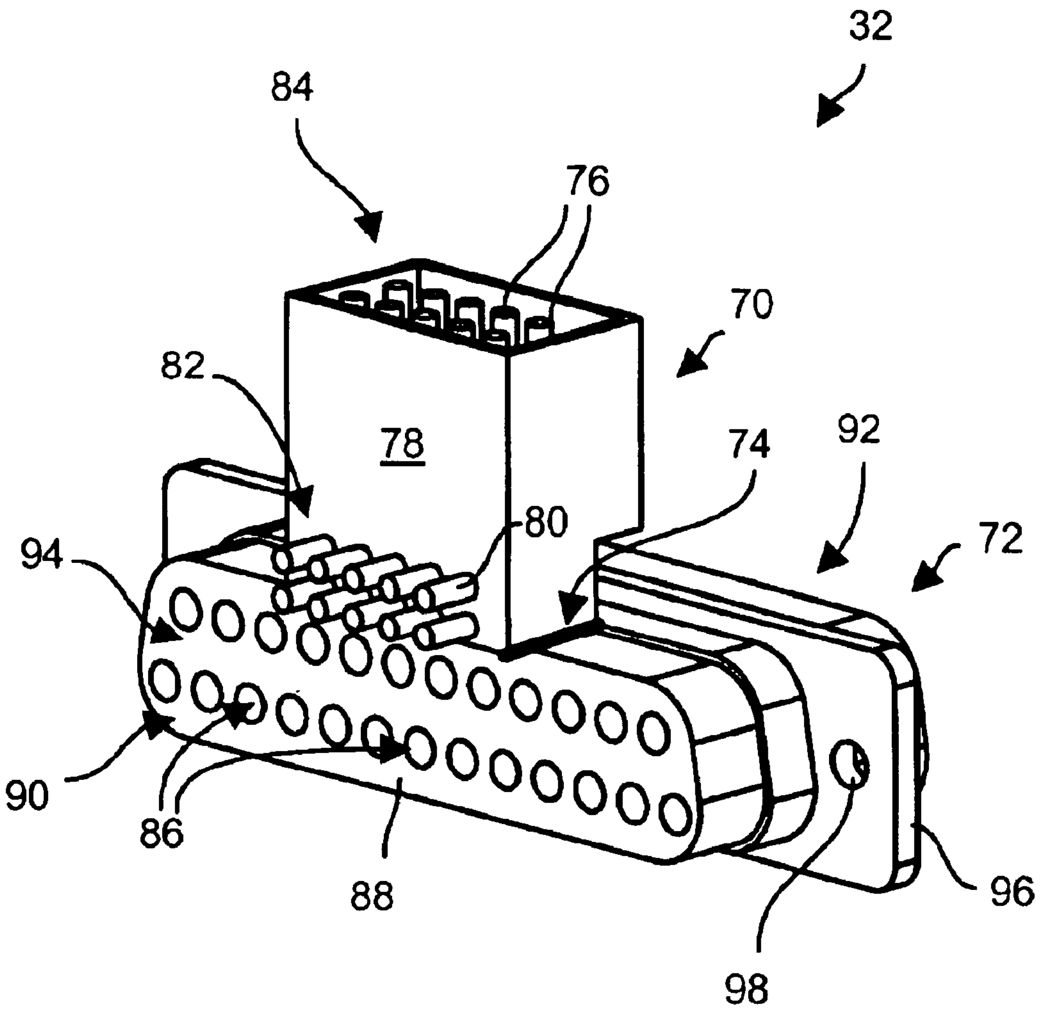
FIG. 2 is a perspective view of an adaptor of the connection system of FIG. 1.

FIG. 2 shows particular details of an adaptor 32. As shown, the adaptor 32 includes a circuit board (or PCB) connector 70, a switchbox connector 72, and a fastener 74. In one arrangement, the fastener 74 includes a thin layer of adhesive which bonds the circuit board connector 70 to the switchbox connector 72.

As shown in FIG. 2, the circuit board connector 70 includes a set of contacts 76 and a circuit board connector housing 78. Ends 80 of the set of contacts 76 extend through the circuit board connector housing 78 to define a circuit board mounting interface 82. The circuit board connector housing 78, in addition to defining the circuit board mounting interface 82, further defines a connector interface 84 that is at a right angle to the circuit board mounting interface 82. By way of example only, the circuit board connector 70 includes, as the set of contacts 76, 10 circuit board pins.

As further shown in FIG. 2, the switchbox connector 72 includes a set of contacts 86 (shown generally by arrows 86) and a switchbox housing 88. In one arrangement, adhesive (e.g., plastic cement) bonds the switchbox housing 88 (e.g., non-conductive material) to the circuit board connector housing 78 (e.g., non-conductive material). The switchbox housing 88 defines a cable attachment interface 90 and a connector interface 92. The switchbox housing 88 further defines locations 94 for receiving and holding the contacts 86. By way of example only, the switchbox housing 88 defines a set of 25 locations 94 for holding up to 25 crimps (i.e., contacts 86). In one arrangement, the connector interface 92 is a D-Sub connector interface and the locations 94 are standardized positions for contacts carrying particular signals (e.g., RS-232 signals). As such, the switchbox connector 72 further includes an outer metallic casing 96 that defines screw holes 98 (or alternatively holds screws that thread into a complementary D-Sub connector interface).

As will be discussed later, the adaptor 32 further includes a set of conductors that connect the set of contacts 76 of the circuit board connector 70 with the set of contacts 86 of the switchbox connector 72. In particular, the set of conductors extends from the circuit board mounting interface 82 defined by the circuit board connector housing 78 to the cable attachment interface 90 defined by the switchbox connector housing 88. The adaptor 32 further includes a coating to protect the set of conductors. Further details of the invention will now be provided with reference to FIGS. 3 through 5.

Figure 3:
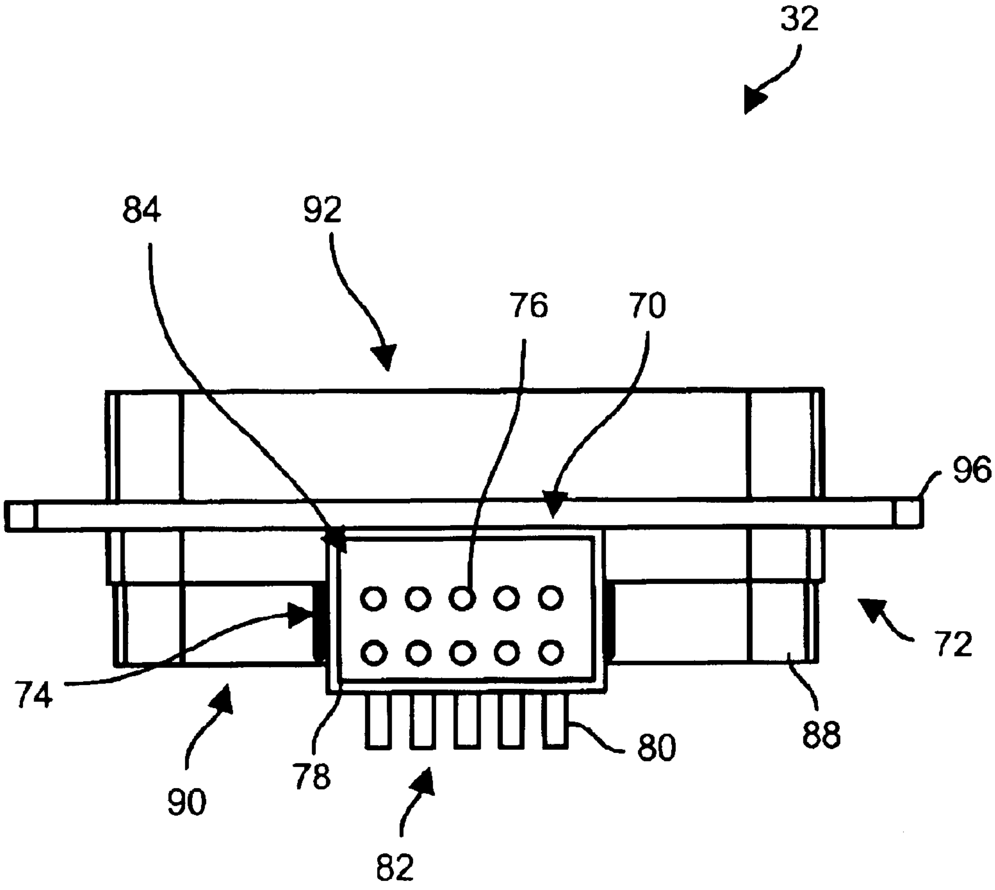
FIG. 3 is a top view of the adaptor of FIG. 2.

FIG. 3 shows a top view of the adaptor 32. As shown, the contacts 76 at the connector interface 84 of the circuit board connector 70 are arranged in a 2×5 array. Other contact arrangements are suitable for use as well for the circuit board connector 70.

Figure 4:
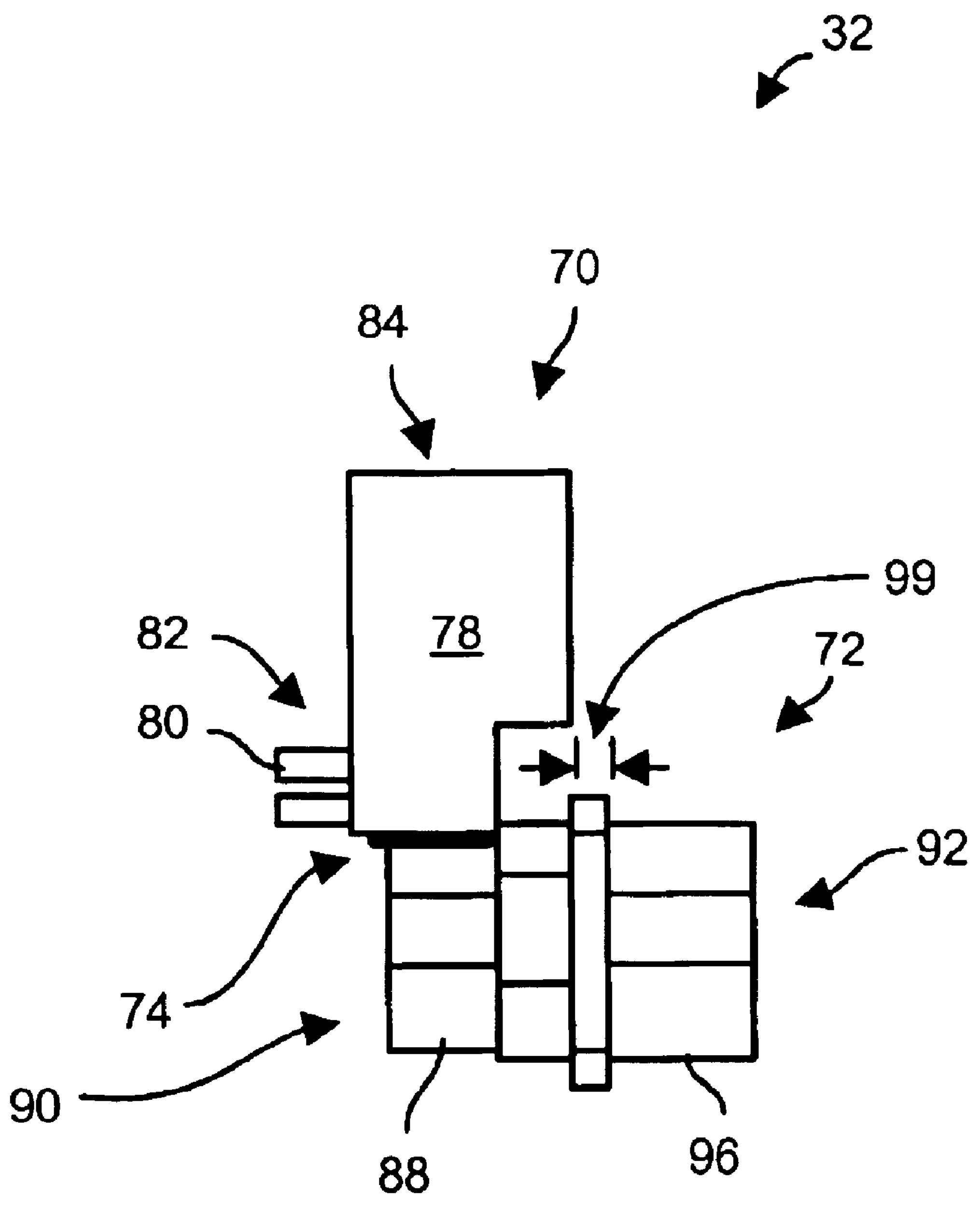
FIG. 4 is a side view of the adaptor of FIG. 2.

FIG. 4 shows a side view of the adaptor 32. The connector interface 84 of the circuit board connector 70 is at a right angle to the connector interface 92 of the switchbox connector 72. Accordingly, when connector interface 92 of the switchbox connector 72 mates with the multi-port switch 28 (FIG. 1), the connector interface 84 of the circuit board connector 70 extends at a right angle. Preferably, the positioning of the circuit board connector 70 relative to the switchbox connector 72 provides a clearance region 99 that permits easy and convenient engagement of a cable assembly 34 with the connector interface 92 when the switchbox connector 72 mates with a corresponding switchbox connector (e.g., one of the secondary ports 38 of the multi-port switch 28, see FIG. 1).

Figure 5:
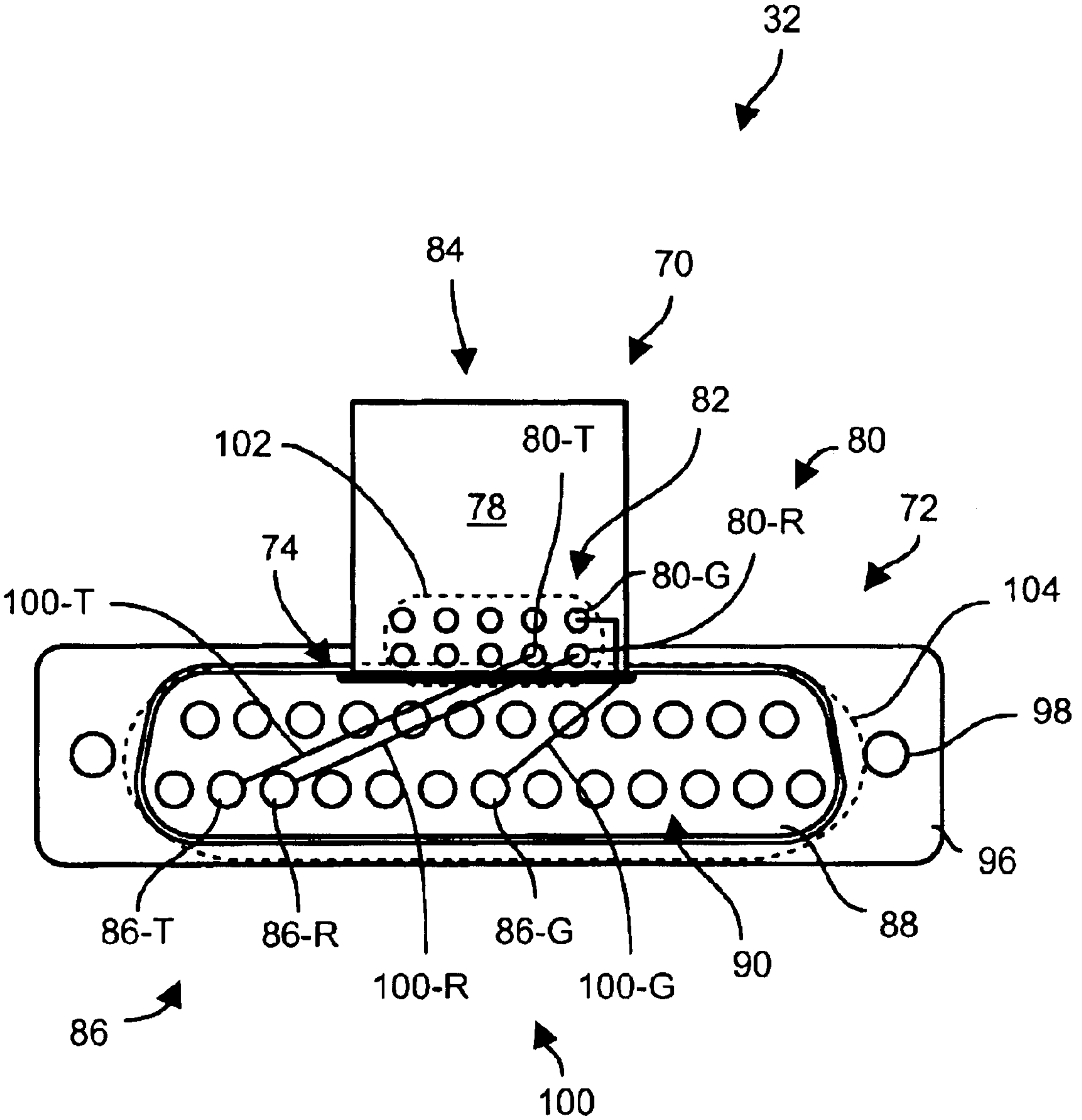
FIG. 5 is a rear view of the adaptor of FIG. 2.

FIG. 5 shows a rear view of the adaptor 32. As shown, the set of contacts 80 of the circuit board connector 70 include a transmit pin 80-T for carrying a transmit signal, a receive pin 80-R for carrying a receive signal and a ground pin 80-G for carrying a ground signal. Similarly, the set of contacts 86 of the switchbox connector 72 include a transmit crimp 86-T for carrying the transmit signal, a receive crimp 86-R for carrying the receive signal and a ground crimp 86-G for carrying the ground signal. The crimps 86 preferably reside in standardized locations (e.g., based on the RS-232 standard) for use with standard, off-the-shelf parts (e.g., standard computer I/O ports, standard switchboxes, other accessories, etc.). The adaptor 32 includes a set of conductors 100 which include a transmit conductor 100-T that connects the transmit pin 80-T and the transmit crimp 86-T together, a receive conductor 100-R that connects the receive pin 80-R and the receive crimp 86-R together, and a ground conductor 1 00-G that connects the ground pin 80-G and the ground crimp 86-G together.

As further shown in FIG. 5, the circuit board connector 70 has a footprint 102 and the switchbox connector 72 has a footprint 104. In one arrangement, the footprint 102 of the circuit board connector 70 is smaller than the footprint 104 of the switchbox connector 72. Accordingly, the circuit board connector 70 itself can be smaller than the switchbox connector 72. As a result, the circuit boards 24 can have connectors 46 which are (i) similar in size to the circuit board connector 70 and (ii) smaller in size than the switchbox connector 72 in order to conserve circuit board space while remaining connectable with an adaptor 32 using a standard, off-the-shelf cable assembly 34 having complementary circuit board connectors 50, 52 at each end.

As shown in FIGS. 4 and 5, the distance between circuit board mounting interface 82 of the right angle PCB connector 70 and the cable attachment interface 90 of the switchbox connector 72 is small thus enabling the set of conductors 100 (e.g., wires, metal strips, etc.) to be relatively short. Further details of the invention will now be provided with reference to FIG. 6.

Figure 6:
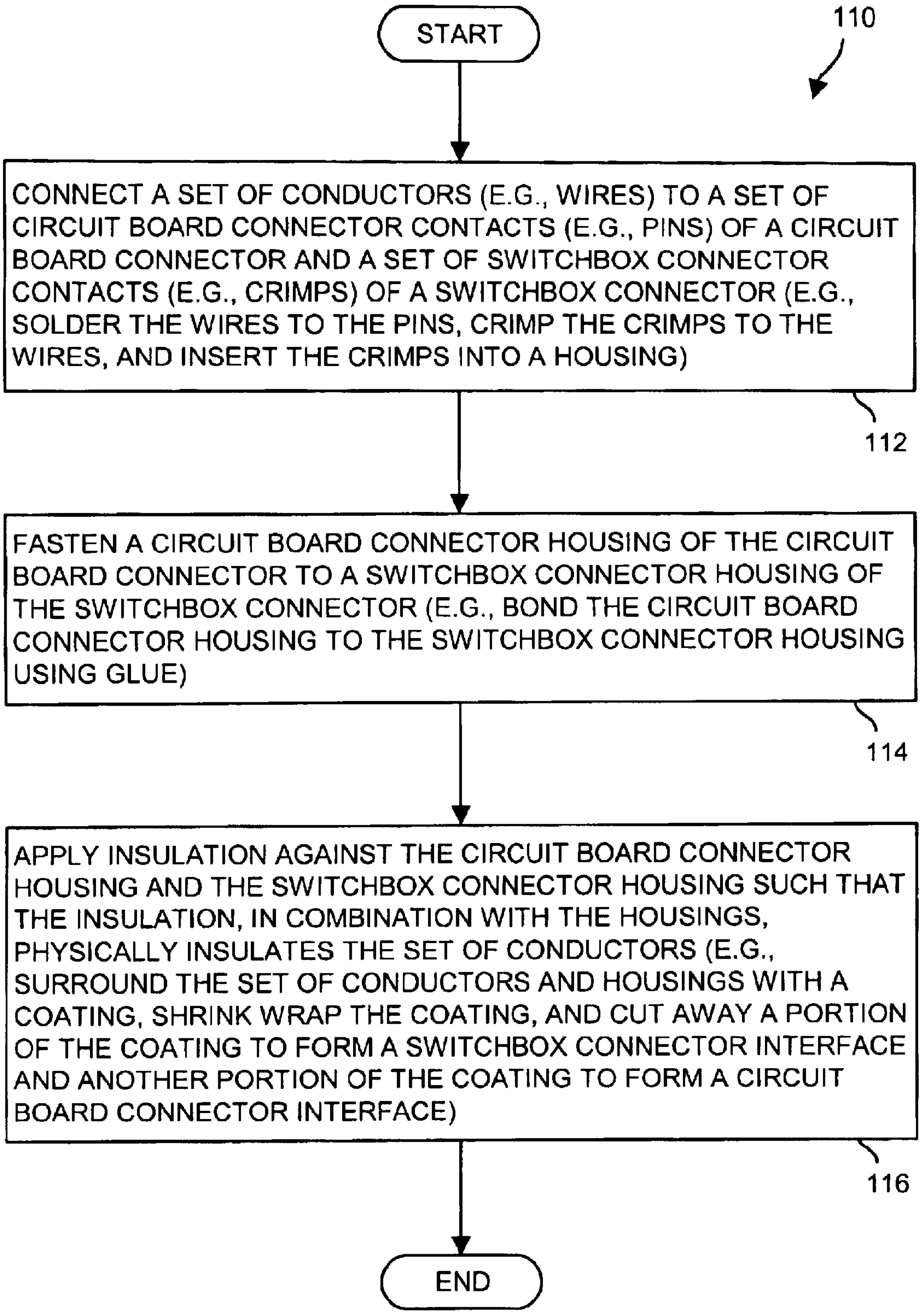
FIG. 6 is a flowchart of a procedure for providing the adaptor of FIG. 2.

FIG. 6 is a flowchart of a procedure 110 performed by a manufacturer in order to provide the adaptor 32 of FIGS. 2 through 5. In step 112, the manufacturer connects the set of conductors 100 to the set of circuit board connector contacts 80 of the circuit board connector 70 and to the set of contacts 86 of the switchbox connector 72. In one arrangement, the manufacturer (i) solders first ends of wires (the set of conductors 100) to pins (the set of contacts 80) of the circuit board connector 70 and (ii) crimps second ends of the wires to crimps (the set of contacts 86) of the switchbox connector 72, and inserts the crimps into the switchbox connector housing 88 of the switchbox connector 72.

In step 114, the manufacturer fastens the circuit board connector 70 and the switchbox connector 72 together. For example, the manufacturer bonds the circuit board connector housing 78 with the switchbox connector housing 88 using a layer of adhesive in order to fasten the two connectors 70, 72 together.

In step 116, the manufacturer applies insulation against the circuit board connector housing 78 and the switchbox connector housing 88 such that the insulation, in combination with the housings 78, 88 physically insulates the set of conductors 100. Accordingly, the conductors 100 are held in place and are now protected against damage and/or possible shorting if inadvertently hit. For example, the manufacture can surround the set of conductors 100 and the housings 78, 88 with a shrink wrap coating, shrink the coating (e.g., by applying heat) and cut away portions of the coating to expose the connector interfaces 84, 92. The end result is the adaptor 32 which is capable of mounting to a secondary port 36 of the multi-port switch 28 in order to reliably convey signals between a circuit board 32 and the electronic device 28 (also see FIG. 1).

As described above, embodiments of the invention are directed to circuit board accessing techniques which utilize an adaptor 32 having a printed circuit board (PCB) connector 70 and a switchbox connector 72 (e.g., a D-Sub connector). In one arrangement, a user can easily connect with and access multiple circuit boards 24 using connection components 26 having multiple adaptors 32 and a variety of standard, off-the-shelf parts. The features of the invention, as described above, may be employed in computerized systems, apparatus and procedures as well as other electronic devices such as those of EMC Corporation of Hopkinton, Massachusetts.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the multi-port switch 28 was described above as being a standard switchbox having four secondary ports 38 by way of example only. The multi-port switch 28 can have a different number of secondary ports 38 (e.g., it can be a two-way A-B switchbox, it can include 6 secondary ports 38, etc.). Furthermore, the multi-port switch 28 can be more sophisticated than a conventional manually operated knob-controlled switch. Rather, the multi-port switch 28 can be push-button controlled, computer controlled (i.e., electronically controlled), etc.

Additionally, it should be understood that the adaptor 32 was described above as including a circuit board connector 70 and a switchbox connector 72 which are fastened together using an adhesive. The use of the adhesive (e.g., heavy duty cement) is a simple and low cost fastening means. Other fastening mechanisms are suitable for use as well such as screws, interlocking flanges, etc. In one arrangement, each of the connectors 70, 72 includes an outer metallic shield (e.g., a chassis ground) which are connected together by a fastener (e.g., a screw, nuts and bolts, welds, solder, etc.).

Furthermore, it should be understood that the insulated coating that protects the set of conductors 100 of FIG. 5 was described as being a shrink wrap coating by way of example only. In other arrangements, the adaptor 32 includes, as the fastener 74, a molded coating (e.g., molded rubber) which simultaneously holds the connectors 70, 72 together and protects the set of conductors 100 from damage.

Additionally, it should be understood that the adaptors 32 were described above as mating directly with multi-port switch 28 by way of example only. In other arrangements, the adaptors 32 mate with the PCB connectors 46 of the circuit boards 24 directly, and the cable assemblies 34 extend from the adaptors 32 to the multi-port switch 28.

Furthermore, it should be understood that the adaptors 32 are suitable for use in applications other than the connector system 20. For example, an adaptor 32 can be connected directly to the I/O port of a computer (e.g., directly to the port 42 of the electronic device 22) thus enabling connection to a circuit board using a standard cable having a circuit board connector at both ends. As another example, the adaptor 32 can be connected directly to the circuit board connector 46 of a circuit board 24 thus enabling connection to the electronic device 22 using a standard cable having the same connector at both ends (e.g., D-Sub connectors). Such uses of the adaptor 32 alleviate the need for a user to obtain or make a customized cable having a different connector at each end.

Additionally, it should be understood that the adaptor 32 was described above as using a 10 pin PCB connector 70 and a 25 location D-sub connector 72 by way of example only. The PCB connector 70 can have a different number of pins such as 4, 6, 8, 12, etc. Similarly, the D-Sub connector 72 can have a different number of contact locations such as 9, 15, 25, 37, 50, etc.

Furthermore, it should be understood that the adaptor 32 was described as using, as the connector 72, a crimp-type D-Sub connector by way of example only. Other connectors are suitable for use as the connector 72 as well such as a solder-type D-Sub connector, DIN connectors, IEEE connectors, LFH connectors, RJ45 connectors, RJ11 connectors, V0.35 connectors, half-pitch DB connectors, other USB connectors, and the like.

What is claimed is:

1. A method for providing an adaptor, comprising the steps of:

connecting a set of conductors to (i) a set of circuit board connector contacts of a circuit board connector and (ii) a set of switchbox connector contacts of a switchbox connector;

fastening a circuit board connector housing of the circuit board connector to a switchbox connector housing of the switchbox connector; and applying insulation against the circuit board connector housing and the switchbox connector housing such that the insulation, in combination with the circuit board connector housing and the switchbox connector housing, physically insulates the set of conductors, wherein the step of applying the insulation against the circuit board connector housing and the switchbox connector housing includes the step of:

providing a coating over the set of conductors, and shrink wrapping the coating such that the coating, in combination with the circuit board connector housing and the switchbox connector housing, physically covers the set of conductors.

2. The method of claim 1 wherein the set of circuit board connector contacts includes soldering pins, wherein the set of switchbox connector contacts include crimps, and wherein the step of connecting the set of conductors to the set of circuit board connector contacts of the circuit board connector and the set of switchbox connector contacts of the switchbox connector includes the steps of:

soldering wires to the soldering pins; and crimping the wires to the crimps.

3. The method of claim 2, further comprising the step of:

inserting the crimps, which are crimped to the wires, into crimp locations of the switchbox connector housing.

4. The method of claim 1 wherein the step of fastening the circuit board connector housing of the circuit board connector to the switchbox connector housing of the switchbox connector includes the step of:

bonding the circuit board connector housing to the switchbox connector housing using adhesive.

5. The method of claim 1 wherein the step of providing the coating over the set of conductors includes the step of:

surrounding the set of conductors, the circuit board connector housing and the switchbox connector housing with the coating; and cutting away a first portion of the coating to form a switchbox connector interface, and a second portion of the coating to form a circuit board connector interface.

6. The method of claim 1 wherein the set of circuit board connector contacts is capable of inserting into a circuit board, and wherein the step of connecting the set of conductors to the set of circuit board connector contacts of the circuit board connector and the set of switchbox connector contacts of the switchbox connector includes the step of:

providing a set of conductive pathways between the set of switchbox connector contacts of the switchbox connector and the set of circuit board connector contacts which is capable of inserting into the circuit board.

7. The method of claim 1 wherein the step of fastening includes the step of:

attaching the circuit board connector and the switchbox connector together in an orientation where the circuit board connector provides a connector interface and the switchbox connector provides a switchbox interface which are substantially perpendicular to each other.

* * * * *